United States Patent
Okushima et al.

(10) Patent No.: US 7,154,393 B2
(45) Date of Patent: Dec. 26, 2006

(54) OBJECT DETECTION SENSOR

(75) Inventors: Akihiro Okushima, Aichi (JP);
Hiroyuki Sueyasu, Kasugai (JP);
Keiichi Nagayama, Aichi (JP);
Yukinori Kurumado, Nagoya (JP)

(73) Assignee: OMRON Corporation, Kyoto (JP)

( * ) Notice: Subject to any disclaimer, the term of this patent is extended or adjusted under 35 U.S.C. 154(b) by 107 days.

(21) Appl. No.: 10/843,691

(22) Filed: May 11, 2004

(65) Prior Publication Data

US 2005/0001633 A1    Jan. 6, 2005

(30) Foreign Application Priority Data

May 14, 2003    (JP)    ............... 2003-135581

(51) Int. Cl.
*G08B 13/26*    (2006.01)
(52) U.S. Cl. ............. 340/562; 340/536; 340/436; 340/437; 340/438; 340/552; 341/33; 200/600; 200/181; 200/61.44; 200/61.42
(58) Field of Classification Search ............. 340/562, 340/536, 436, 437, 438, 552; 341/33; 200/600, 200/181, 61.44, 61.42
See application file for complete search history.

(56) References Cited

U.S. PATENT DOCUMENTS

| | | | | |
|---|---|---|---|---|
| 3,728,501 A | * | 4/1973 | Larson et al. | ............. 200/52 R |
| 4,492,958 A | | 1/1985 | Minami et al. | |
| 4,743,895 A | * | 5/1988 | Alexander | ............. 345/174 |
| 5,594,222 A | * | 1/1997 | Caldwell | ............. 200/600 |
| 5,801,340 A | * | 9/1998 | Peter | ............. 178/20.04 |
| 6,724,324 B1 | * | 4/2004 | Lambert | ............. 341/33 |
| 6,825,752 B1 | * | 11/2004 | Nahata et al. | ............. 340/5.64 |
| 6,859,196 B1 | * | 2/2005 | Kehlstadt | ............. 345/156 |
| 2004/0046449 A1 | * | 3/2004 | Eidesheim et al. | ............. 307/10.1 |
| 2004/0070489 A1 | * | 4/2004 | Ueda et al. | ............. 340/5.61 |
| 2005/0206623 A1 | * | 9/2005 | Hein et al. | ............. 345/173 |

FOREIGN PATENT DOCUMENTS

| | | |
|---|---|---|
| EP | 0977363 A2 | 2/2000 |
| FR | 2779889 | 12/1999 |

(Continued)

OTHER PUBLICATIONS

Patent Abstracts of Japan, publication No. 06-162889, publication date Jun. 10, 1994, 2 pages.

(Continued)

*Primary Examiner*—Jeffery Hofsass
*Assistant Examiner*—Edny Labbees
(74) *Attorney, Agent, or Firm*—Osha Liang LLP

(57) ABSTRACT

An object detection sensor wherein a detection electrode (electrode connected with a detection circuit via a conductor) is not exposed from a surface and an input signal is scarcely reduced when a contact area is small, which is capable of reliably detecting a contact thereof with an object in a manner substantially the same as that in the case of a large contact area even when the contact area is small is provided. The object detection sensor is provided with a sensor case made from an insulating material, a detection electrode (electrode A) disposed on an inner surface of the sensor case, a touch electrode (touch electrode A) disposed at a position opposed to the detection electrode on an outer surface of the sensor case and capacitance-coupled to the detection electrode, and a detection circuit which is connected to the detection electrode and detects a contact of an object with the touch electrode based on a change in electrostatic capacitance between the detection electrode and the ground to output a detection signal.

8 Claims, 9 Drawing Sheets

FOREIGN PATENT DOCUMENTS

JP          2733300      12/1997

OTHER PUBLICATIONS

English translation of Office Action dated Dec. 14, 2005 issued by Korean Patent Office against Application No. 10-2004-0033863, 7 pages.

English Translation of Japanese Unexamined Publication No. 1994-162889 dated Jun. 10, 1994 cited in the English translation of Office Action dated Dec. 14, 2005 issued by Korean Patent Office against Application No. 10-2004-0033863, 7 pages.

European Search Report for European Patent Application No. 04011278.1-2215 dated Jul. 18, 2006, 3 pages.

English language translation of French Patent No. FR-2779889, 1 page.

* cited by examiner

OBJECT DETECTION SENSOR

BACKGROUND OF THE INVENTION

1. Field of the Invention

The present invention relates to an object detection sensor suitably used as, for example, a switch for opening and closing operations of a trunk of a vehicle.

2. Description of the Related Art

An object detection sensor for detecting a contact thereof with an object such as a human body (including an approach to the object in a very narrow space) is widely used as an operation switch of various apparatuses.

A common touch sensor such as the one shown in FIG. 8A has heretofore been known as the object detection sensor of the above type. In the touch sensor, a touch electrode 2 is disposed on a surface of a front face portion (a portion for detecting the contact) of a sensor case 1 and connected to a detection circuit which is formed on a circuit substrate 3 provided in the sensor case 1 via a wiring 4 penetrating the front face portion of the sensor case 1. The reference numeral 5 denotes a housing for an apparatus to which the sensor is mounted, and the housing usually has a ground potential. The detection circuit detects the contact based on a change in potential or magnetic field which is caused by the contact of the touch electrode 2 with the human body or the like.

Also, as a sensor wherein a detection electrode is not exposed, a sensor of electrostatic capacitance type disclosed in JP-A-6-162889 is known. As shown in FIG. 8B, in the sensor of this type, a detection electrode 7 (detection element) is disposed on an inner surface of a front face portion of a sensor case 6 (surface material) and connected to a detection circuit which is on a circuit substrate 8 provided in the sensor case 6 via a wiring 9 in the sensor 6. In addition, the detection circuit detects the human body or the like based on a change in floating capacitance which is formed by the detection electrode 7 (electrostatic capacitance between the detection electrode 7 and the ground) and caused by an approach of the human body (an approach to the extent that the human body contacts with the front projection portion of the sensor case 6). Further, the sensor case 6 is projected frontward (upward in FIG. 8B) in order to prevent the front face side of the detection electrode 7 from being wet with water.

The conventional object detection sensor described above has the following problems.

Since it is necessary to form the wiring 4 in such a fashion as to penetrate the front face portion of the sensor case 1, the object detection sensor shown in FIG. 8A has a drawback of bad assembly efficiency. Also, since the touch electrode 2 serving as the detection electrode is exposed, it is highly likely that malfunction is caused due to water wetting (for example, water wetting which provides conduction between the housing 5, that is, the ground, and the touch electrode 2), thereby making it ultimately difficult to use the object detection sensor in an environment where water drops are scattered, such as in the rain.

In turn, since the detection electrode of the electrostatic capacitance type sensor such as the one disclosed in JP-A-6-162889 is not exposed, the electrostatic capacitance type sensor is free from the above-described drawback. However, the floating capacitance which is the input signal to the detection circuit changes by a large scale depending on a contact area (area of the portion opposed to the detection electrode 7) of the human body (usually the fingertip) contacting with the detection electrode 7 and the change in floating capacitance is remarkably reduced when the contact area is small (for example, in the case where the fingertip slightly touches the detection electrode 7 as indicated by the dotted line in FIG. 8B). Therefore, the electrostatic capacitance type sensor has a drawback of failing to detect the human body or the like without a considerable degree of increase in sensitivity of the detection circuit. Further, in the case where the sensitivity of the detection circuit is increased so as to reliably detect the human body or the like even when the contact area is small, it is highly likely that the malfunction is caused by water drops and the like. Since it is impossible to increase the sensitivity of the detection circuit in the environment where water drops are scattered or in the environment where there is too much noise due to other dielectric contaminants, the electrostatic capacitance type sensor fails to detect the human body or the like without a sufficient contact area in the end. Thus, the electrostatic capacitance type sensor is insufficient in terms of usability and responsiveness. As a method of increasing the sensitivity of the detection circuit, it is known to set a small difference between a threshold value of the detection and an input signal (a margin of a threshold value) during the non-contact period in the detection circuit or to increase an amplifying ratio of the input signal in the detection circuit. However, with both of the method, the malfunction tends to occur due to the water drops and the noise of other dielectric contaminants or the temperature drift. In the case of increasing the amplifying ratio, the power consumption of the detection circuit is disadvantageously increased.

SUMMARY OF THE INVENTION

An object of the present invention is to provide an object detection sensor wherein a detection electrode (electrode connected with a detection circuit via a conductor) is not exposed from a surface and an input signal is scarcely reduced when a contact area is small, the object detection sensor being capable of reliably detecting a contact thereof with an object in a manner substantially the same as that in the case of a large contact area even when the contact area is small and, preferably, being reduced particularly in occurrence probability of malfunction due to water drops and the like.

The object detection sensor of the invention comprises: a supporting member made from an insulating material; a detection electrode disposed on an inner surface of the supporting member; a touch electrode which is disposed on an outer surface of the supporting member at a position opposed to the detection electrode and capacitance-coupled to the detection electrode; and a detection circuit which is connected to the detection electrode and detects a contact of an object with the touch electrode based on a change in electrostatic capacitance between the detection electrode and the ground and to output a detection signal.

As used herein, "object" means a dielectric which can change the electrostatic capacitance, such as a human body. The detection circuit may be formed in the supporting member (on a back side of the detection electrode) or on the circuit substrate which is disposed on a back side of the supporting member.

When the object having a high dielectric ratio, such as the human body, contacts the touch electrode of the object detection sensor of the invention, the electrostatic capacitance between the detection electrode and the ground changes largely owing to a function of the touch electrode even when the contact area is small. The electrostatic capacitance (i.e. the input signal to the detection circuit)

formed at the time of the object contact is considerably larger than that formed at the time of non-contact, i.e. electrostatic capacitance formed when no object contacts the touch electrode, without a great difference between the electrostatic capacitance formed when the contact area is small and the electrostatic capacitance formed when the contact area is large. Thus, it is possible to reliably detect the human body or the like even when the contact area is small without increasing sensitivity of the detection circuit. Therefore, it is possible to improve usability and responsiveness while avoiding the above-described disadvantage caused by the increase in sensitivity of the detection circuit.

Further, in the object detection sensor of the invention since the detection electrode connected to the detection circuit via a conductor is disposed on the inner surface of the supporting member without being exposed, the above-described drawback otherwise caused by the exposure of detection electrode from the surface is overcome.

According to one preferred embodiment of the invention, a difference correction detection electrode is disposed at a position which is on a periphery of the detection electrode and on the inner surface of the supporting member, and the detection circuit operates a difference between a value corresponding to the electrostatic capacitance between the detection electrode and the ground and a value corresponding to electrostatic capacitance between the difference correction detection electrode and the ground to detect a contact of an object with the touch electrode based on the change in the difference and to output a detection signal.

According to this embodiment, noises such as water drops and influences such as temperature drifts are cancelled, so that more sensitive and highly reliable contact detection is achieved.

In this case, it is preferred to dispose a difference correction touch electrode which is capacitance-coupled with the difference correction detection electrode on the outer surface of the supporting member at a position opposed to the difference correction detection electrode. With such constitution, it is possible to keep the capacitance formed by the detection electrode and the capacitance formed by the difference correction detection electrode at a substantially identical value at the time of non-contact, thereby enhancing accuracy of the canceling to a maximum degree.

Also, it is preferred that the difference correction detection electrode is disposed between the detection electrode and the ground (for example, a car body). With such arrangement, the reliability of eliminating the influence of water by the canceling is further improved when water is present between the detection electrode and the ground (i.e., malfunction due to water is liable to occur).

According to another preferred embodiment of the invention, a shield electrode for shielding is provided in such a fashion as to cover a non-detection region including at least a back side of the detection electrode.

In this case, thanks to the shielding effect of the shield electrode, it is possible to increase directivity particularly of a detection side (a face on which the touch electrode is disposed) and to ultimately reduce probability of malfunction when the dielectric contacts with the back face or the like of the supporting member, which is not the desired detection position. Further, it is possible to eliminate adverse influences of a component (for example, a car body) which has the ground potential and is provided on the backside of the detection electrode, thereby avoiding malfunction or performance decrement otherwise caused by the component.

According to yet another preferred embodiment of the invention, the supporting member has a front face portion projected from a mounting face of a backside; the touch electrode is disposed on an outer surface of the projected front face portion; and the detection electrode is disposed on the inner surface of the front face portion.

With such constitution, even in a poor environment where rain drops directly fall on the object detection sensor (for example, when the object detection sensor is mounted on an outer surface of a car body), it is possible to reduce probability of malfunction due to water. In this case, situations in which the malfunction due to water tends to occur, i.e. situations wherein the outer surface of the front face portion, on which the touch electrode is disposed, is covered with water and wherein water flows to continuously cover a portion between the touch electrode and the car body (the ground), are prohibited thanks to the above-described projection-like shape.

In this case, it is preferred that a laterally projecting protection portion (for example, in the shape of a mushroom) is formed on each of side rims of the front face portion of the supporting member. With such constitution, the protection portion interrupts water, so that the situation wherein water adheres or flows to continuously cover the portion between the touch electrode and the car body (ground) is prevented more reliably.

The object detection sensor of the invention is suitably used as an on-vehicle sensor (for example, a switch for opening and closing operations of a trunk of a vehicle) for detecting a contact of a human body or the like with a specific position of a surface of the vehicle. Excellent usability and responsiveness are required of such on-vehicle sensor, and the on-vehicle sensor is very much required to be reliable as to coping with water because rain drops are scattered on the vehicle or the rain falls directly on the vehicle in some cases.

In this case, the supporting member may be provided on a car body in such a fashion that the touch electrode is exposed from a specific position of the car body surface or the supporting member may be formed integrally with the car body in the case where the car body is made from an insulator.

Also, in this case, at least the touch electrode may constitute an accessory member provided on the car body surface. For example, at least a portion between the touch electrode and the detection electrode of the supporting member functions as a base of the accessory member (for example, an emblem) provided on the car body surface, and the touch electrode may be in the form of a coating layer (for example, a plating layer of the emblem) for covering an outer surface of the base. With such constitution, the accessory member functions also as a sensor head to achieve a shared use of the component and to enable the sensor to be mounted on the vehicle without impairing a design of the car body surface.

BRIEF DESCRIPTION OF THE DRAWINGS

FIG. 5 is a diagram showing a water protection effect by a projection shape or the like;

DESCRIPTION OF THE PREFERRED EMBODIMENTS

Hereinafter, one embodiment of the present invention will be described based on the drawings.

The present embodiment is an object detection sensor which detects a contact of a human body (object) or the like with a specific position on a surface of a car body of a vehicle.

Figure 1:
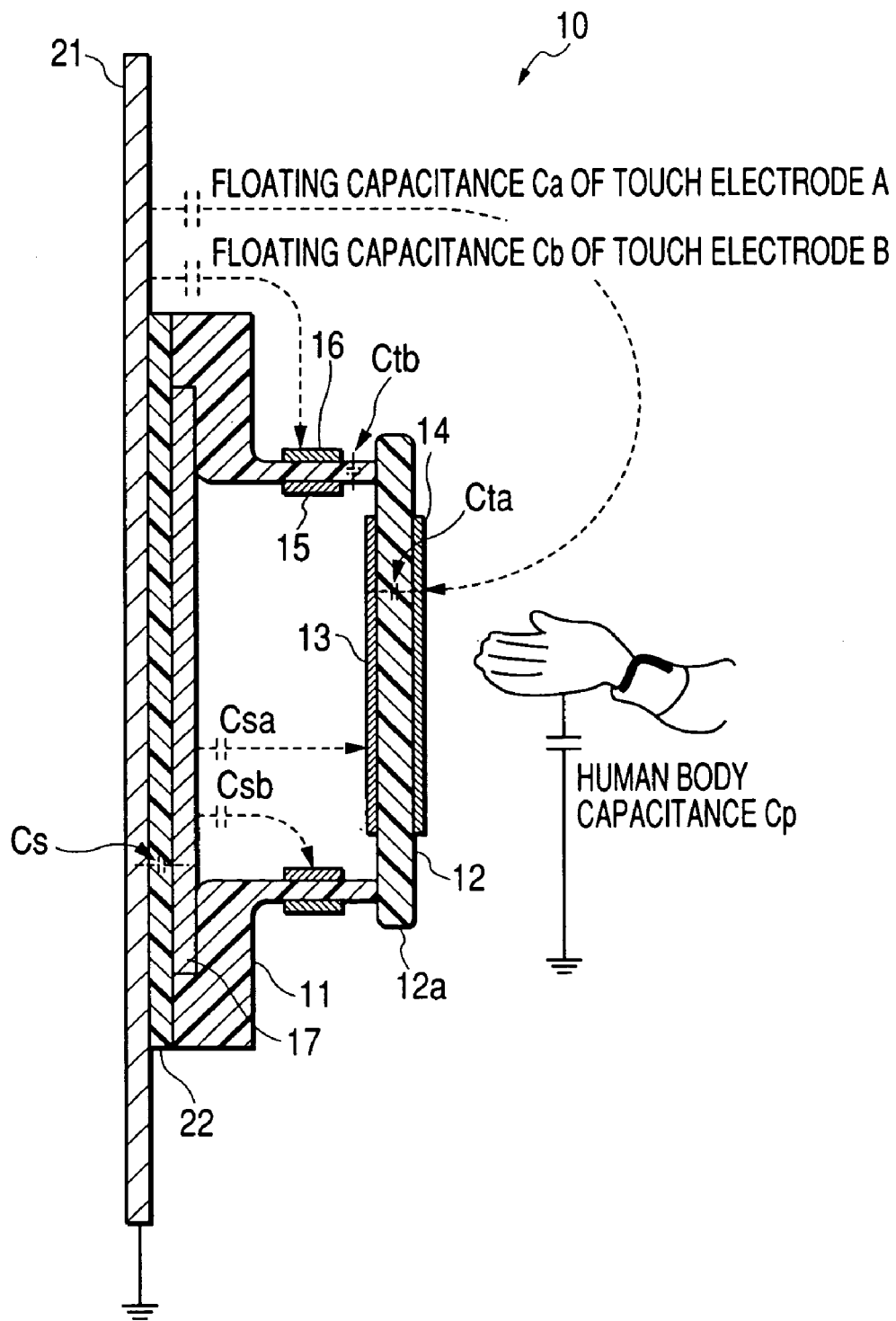
FIG. 1 is a sectional view showing a constitution of a sensor body of an object detection sensor.
Figure 2:
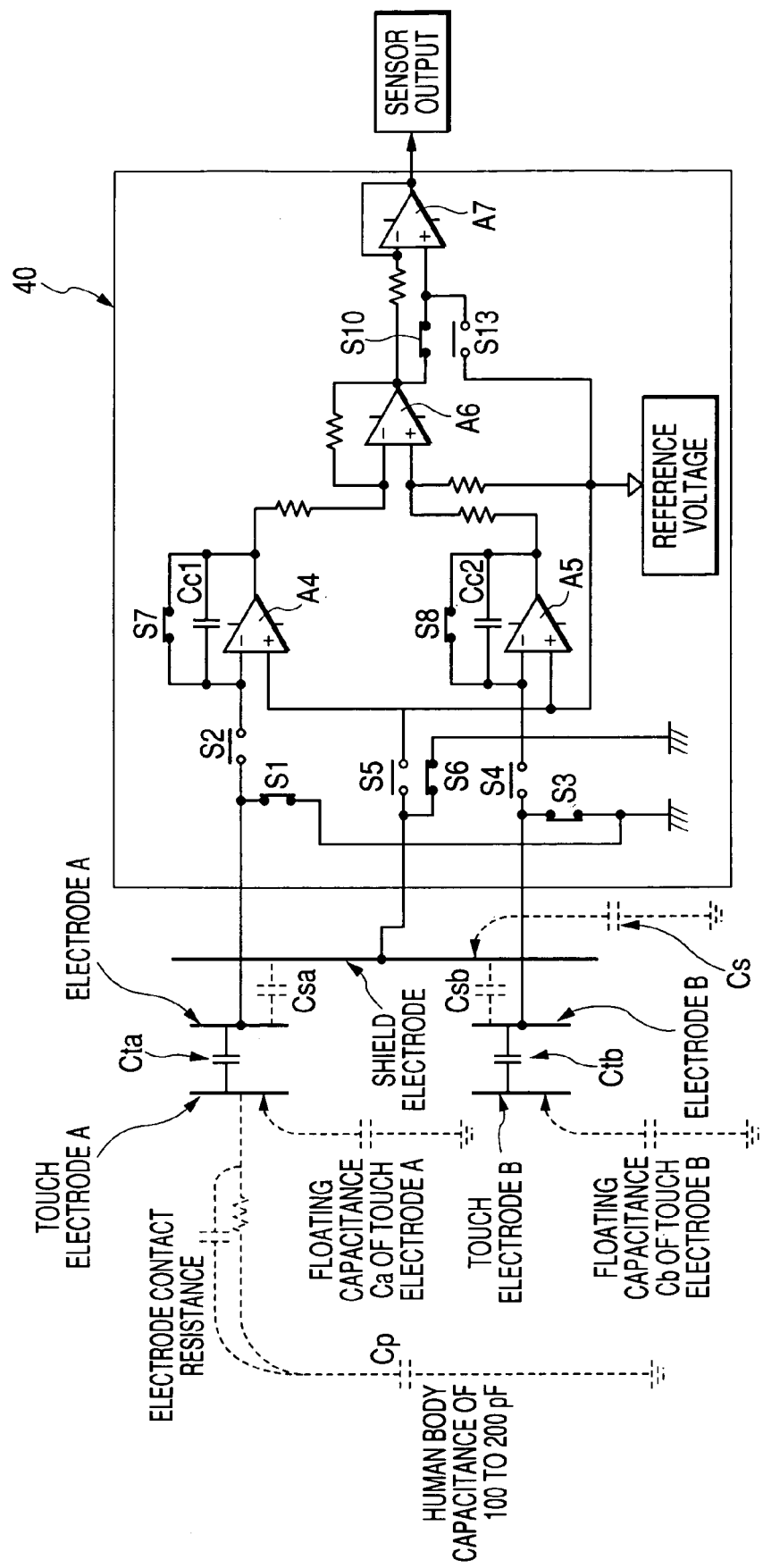
FIG. 2 is a diagram showing a circuit configuration including a detection circuit of the object detection sensor.
Figure 3:
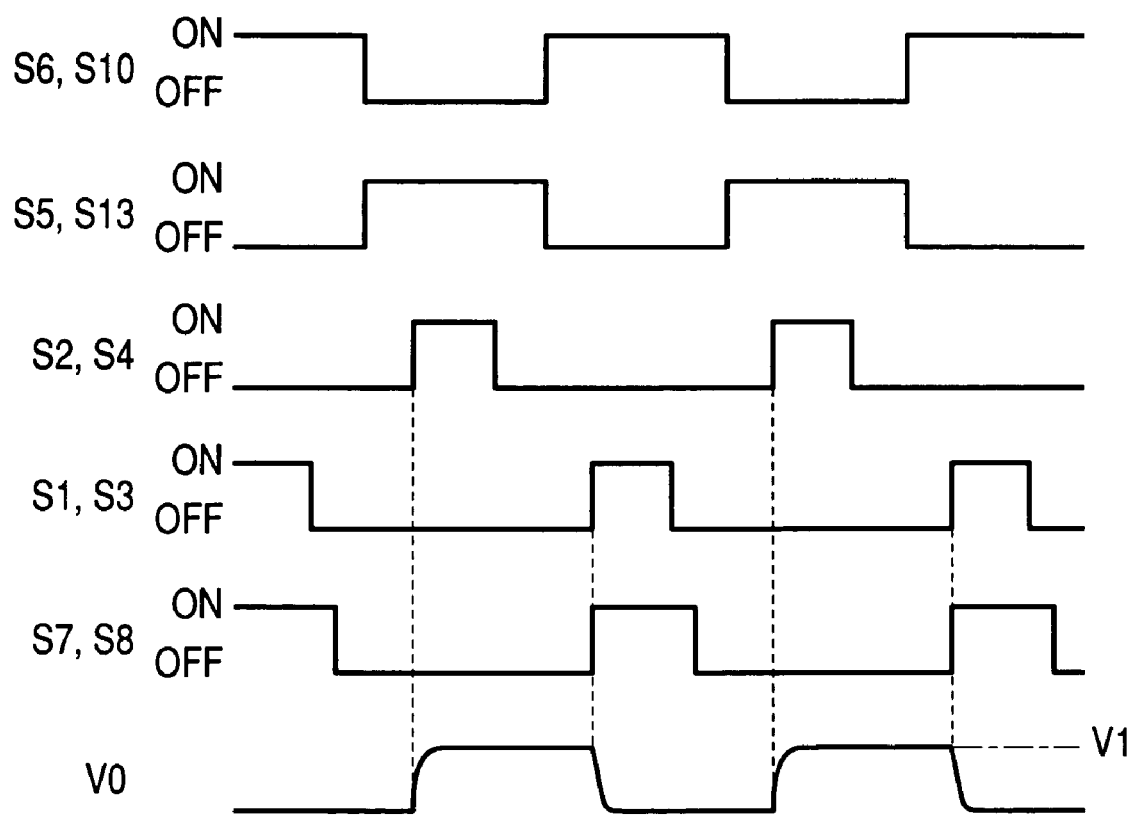
FIG. 3 is a timing chart showing an operation of the detection circuit.
Figure 4A:
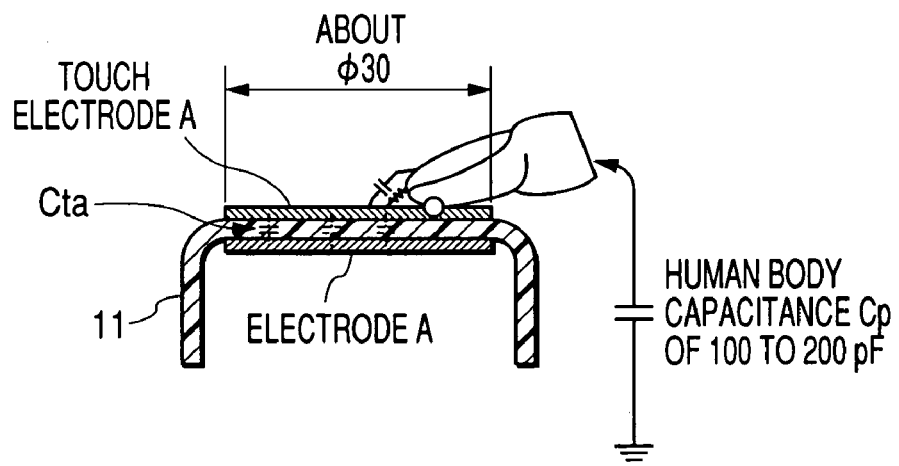
FIGS. 4A and 4B are diagrams for illustrating a function of a touch electrode.
Figure 9A:
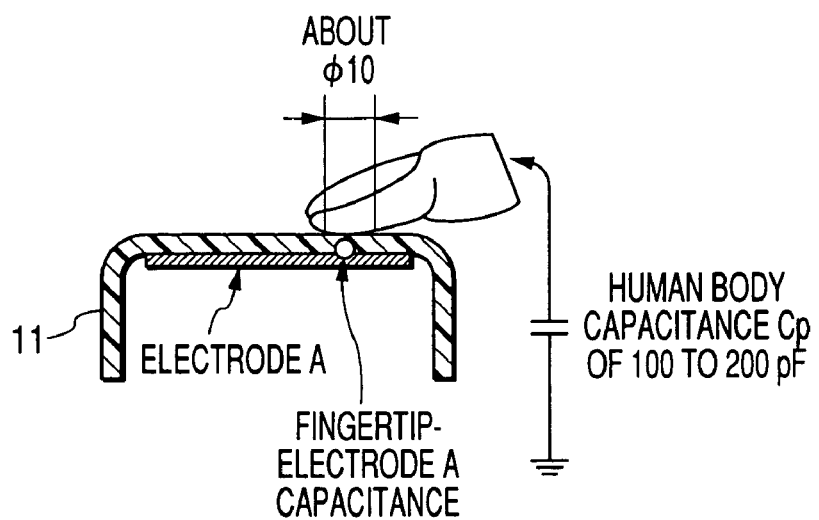
FIGS. 9A and 9B are diagrams showing a comparative example for the purpose of explaining the function of the touch electrode by way of comparison.
Figure 9B:
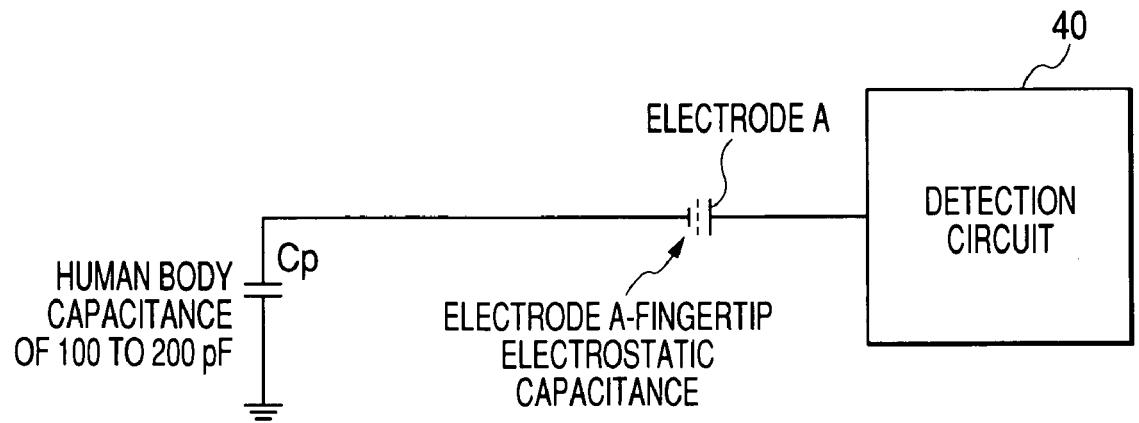

FIG. 1 is a sectional view showing a constitution of a sensor body 10 of the sensor, and FIG. 2 is a diagram showing a circuit configuration including a detection circuit of the sensor. FIG. 3 is a timing chart for illustrating an operation of the detection circuit. FIGS. 4A to 5 are diagrams for illustrating a function of the sensor. FIGS. 9A and 9B are diagrams showing a comparative example for illustrating the function of the sensor by way of comparison.

As shown in FIG. 1, the sensor body 10 is provided with: a sensor case 11 which is a supporting member made from an insulating material; a detection electrode 13 (electrode A) disposed on an inner surface of a thin plate-like front face portion 12 of the sensor case 11; a touch electrode 14 (touch electrode A) which is disposed at a position opposite to the detection electrode 13 on an outer surface of the front face portion 12 and capacitance-coupled with the detection electrode 13; a difference correction detection electrode 15 (electrode B) disposed at a position surrounding a periphery of the detection electrode 13, the position being on an inner surface of the sensor case 11; a difference correction touch electrode 16 (touch electrode B) which is disposed at a position opposite to the difference correction detection electrode 15 (electrode B) on an outer surface of the sensor case 11 and capacitance-coupled with the difference correction detection electrode 15; and a shield electrode 17 disposed in such a fashion as to cover a non-detection region including at least a back side of the detection electrode 13.

The reference numeral 21 in FIG. 1 denotes a car body made from a steel plate or the like, and the reference numeral 22 denotes an insulating sheet which is provided between the car body 21 and the sensor body 10.

The sensor case 11 is a molded product made from a synthetic resin or the like, and the plate-like sensor case 12 thereof is projected from a mounting face on a back side. The sensor case 11 has a hollow shape having a cylindrical side wall portion (not denoted) thereof disposed on a back side of the outer surface of the front face portion 12. In this embodiment, a protection portion 12a projecting in a radial direction (lateral direction) is formed on a whole periphery of the front face portion 12 of the sensor case 11, so that a front face side of the sensor case 11 has a mushroom-like shape.

The detection electrode 13 and the touch electrode 14 are made from a copper foil, for example, and have a disk-like shape and a substantially identical area. The detection electrode 13 and the touch electrode 14 are adhered to the front face portion 12 in such a fashion as to sandwich the front face portion 12, thereby forming electrostatic capacitance suitable for the detection circuit 40 which will be described later in this specification (i.e. the detection electrode 13 and the touch electrode 14 are capacitance-coupled with each other). The difference correction detection electrode 15 and the difference correction touch electrode 16 are made from a copper foil or the like. The difference correction detection electrode 15 and the difference correction touch electrode 16 have a ring-like shape and are attached to the sensor case 11 in such a fashion as to sandwich the side wall portion of the sensor case 11. The difference correction detection electrode 15 and the difference correction touch electrode 16 are adapted to generate electrostatic capacitance which is substantially identical with that formed by the detection electrode 13 and the touch electrode 14 so as to cancel a noise component and a temperature drift component by the difference.

The touch electrode 14 or the touch electrode 14 and the sensor case 11 may constitute an accessory member such as an emblem of a vehicle. For instance, the front face portion 12 of the sensor case 11 may function as a base of the emblem to be provided on a surface of the car body, and the touch electrode 14 may be in the form of a coating layer (ex. a plating layer) covering an outer surface of the base. With such constitution, the accessory member functions also as a sensor head, so that it is possible to achieve a shared-use of the component and to provide the sensor on the vehicle without impairing a design of the car body surface.

The shield electrode 17 (electrode S) is made from an aluminum foil or the like and disposed in such a fashion as to cover the back side of the detection electrode 13 (a back face opening of the sensor case 11 in this embodiment).

The detection circuit will hereinafter be described. Referring to FIG. 2, the reference numeral 40 denotes the detection circuit. The detection circuit 40 is connected to the detection electrode 13 (electrode A) and detects a contact of a human body or the like with the touch electrode 14 (touch electrode A) based on a change in electrostatic capacitance (electrostatic capacitance between the electrode A and the ground) formed by the detection electrode 13 to output a detection signal (sensor output). In this case, the detection circuit 40 operates a difference between a value corresponding to the electrostatic capacitance formed by the detection electrode 13 and a value corresponding to electrostatic capacitance (electrostatic capacitance between the electrode B and the ground) formed by the difference correction detection electrode 15 (electrode B) to detect the contact of the human body with the touch electrode 14 based on a change in the difference.

The detection circuit 40 is formed on a circuit substrate provided in the sensor case 11 (for example, on the back side of the detection electrode 13 and the surface of the shield electrode 17), for example.

As shown in FIG. 2, the detection circuit 40 of this embodiment is constituted of analog switches S1 to S13 which operate periodically by a driving circuit (not shown), operation amplifiers A4 to A7, and so forth.

Referring to FIG. 2, the reference code Cta denotes a condenser which is the electrostatic capacitance formed between the electrode A (detection electrode 13) and the touch electrode A (touch electrode 14). Likewise, a condenser denoted by the reference code Ctb is the electrostatic capacitance formed between the electrode B (detection electrode 15) and the touch electrode B (touch electrode 16). The reference code Ca denotes the electrostatic capacitance between the touch electrode A and the car body 21 or the like (at the ground side), and the reference code Cb denotes the electrostatic capacitance between the touch electrode B and the ground. The reference code Cs denotes electrostatic capacitance formed between the car body 21 (ground) and the electrode S (shield electrode 17). The reference code Cp denotes electrostatic capacitance (usually from 100 to 200 pF) of the human body which contacts with the touch electrode A. The reference code Csa denotes electrostatic capacitance between the electrode S and the electrode A, and the reference code Csb denotes electrostatic capacitance between the electrode S and the electrode B. Note that apparent values of the electrostatic capacitance Csa and Csb are 0 because the electrode A, the electrode B, and the electrode S are basically controlled to have an identical potential.

The analog switches S1 and S2 constitute a pulse driving circuit of the electrode A and are driven by a driving circuit (not shown) to switch the connection of the electrode A at a predetermined cycle. The switch S1 opens and closes a line connecting the electrode A with the ground, and the switch S2 opens and closes a line connecting the electrode A with an inverted input of the operation amplifier A4.

The analog switches S3 and S4 constitute a pulse driving circuit of the electrode B and switch the connection of the electrode B at a predetermined cycle. The switch S3 opens and closes a line connecting the electrode B with the ground, and the switch S4 opens and closes a line connecting the electrode B with an inverted input of the operation amplifier A5.

The analog switches S5 and S6 constitute a pulse driving circuit of the electrode S and switch the connection of the electrode S at a predetermined cycle. The switch S6 opens and closes a line connecting the electrode S with the ground, and the switch S5 opens and closes a line connecting the electrode S with a reference voltage line.

The analog switches S1 and S3 are turned on periodically as shown fourth from the top in FIG. 3. The analog switches S2 and S4 are periodically turned on, too, at the timing when the analog switches S1 and S3 are turned off as shown third from the top in FIG. 3.

The analog switch S5 is turned on after the analog switches S1 and S3 are turned off and before the analog switches S2 and S4 are turned on as well as turned off after the analog switches S2 and S4 are turned off and before the analog switches S1 and S3 are turned on as shown second from the top in FIG. 3. The analog switch S6 is turned on and off at a timing reverse to that of the analog switch S5 as shown first in FIG. 3.

The operation amplifier A4 constitutes a charge integration circuit of the electrode A, and the condenser Cc1 and the analog switch S7 are parallelly connected between the output and the inverted input of the operation amplifier A4. A non-inverted input of the operation amplifier A4 is connected to the reference voltage line, so that a reference voltage is applied thereto. The analog switch S7 serves to open and close a node between terminals of the condenser Cc1 (between the output and the inverted input of the operation amplifier A4) and is turned on simultaneously with the switches S1 and S3 while turned off immediately after the switches S1 and S3 are turned off.

The operation amplifier A5 constitutes a charge integration circuit of the electrode B, and the condenser Cc2 and the analog switch S8 are parallelly connected between the output and the inverted input of the operation amplifier A5. A non-inverted input of the operation amplifier A5 is connected to the reference voltage line, so that a reference voltage is applied thereto. The analog switch S8 serves to open and close a node between terminals of the condenser Cc2 (between the output and the inverted input of the operation amplifier A5) and operates in the same manner as the analog switch S7.

The operation amplifier A6 constitutes a differential circuit for outputting a difference between the output of the operation amplifier A4 (hereinafter referred to as output VA) and the output of the operation amplifier A5 (hereinafter referred to as output VB) after amplifying the difference.

The analog switches S10 and S13 and the operation amplifier A7 constitute a synchronous detection circuit. The synchronous detection circuit outputs a sensor output V1 (detection signal) from an output (hereinafter referred to as difference output V0) of the operation amplifier A6 (differential circuit). In this case, the difference output V0 changes as shown sixth from the tops (lowest) in FIG. 3, and a high voltage portion in a waveform of the difference output V0 (i.e. a voltage when the difference output V0 is stabilized after the switches S7 and S8 are turned off and the switches S2 and S4 are turned on) is output to a controller (not shown) as the sensor output V1 for controlling the opening and closing of the trunk of the vehicle.

The analog switch S10 operates in the same manner as the analog switch S6, and the analog switch S13 operates in the same manner as the analog switch S5 (see FIG. 3).

The controller judges that the contact of human body has been detected when the output V1 of the detection circuit 40 exceeds a predetermined threshold value. The threshold value is set between a value of the sensor output V1 at the time of the contact of the human body or the like with the touch electrode A and a value of the sensor output V1 at the time of the non-contact when there is no contact of object. As described later in this specification, since there is a great difference between the values irrelevant from the contact area, it is possible to set the threshold value with a sufficient margin.

With the detection circuit 40 of the above-described constitution, when the analog switches S1, S3, and S6 are turned on, the electrostatic capacitance formed by each of the electrodes (electrodes A, B, and S) is shunted to achieve a terminal-based voltage of 0. Also, since the analog switches S7 and S8 are turned on, too, when the analog switches S1, S3, and S6 are turned on, a terminal-based voltage of each of the condensers Cc1 and Cc2 is 0 and, therefore, each of the output VA and the output VB becomes the reference voltage. Thus, the difference voltage V0 when the analog switches S1, S3, and S6 are turned on is 0.

After that, when the analog switches S1 and S3 and the analog switches S7, S8, and S6 are turned off in the order and the analog switches S5 and the analog switches S2 and S4 are turned on in the order, the shunting of the condensers Cc1 and Cc2 is released so that the reference voltage is applied to each of the electrodes (electrodes A, B, and S). Therefore, a voltage corresponding to a capacitance ratio between the electrostatic capacitance of the electrode A including the electrostatic capacitance Cta and Ca and the condenser Cc1 is output as the output VA, and, similarly, a voltage corresponding to a capacitance ratio between the electrostatic capacitance of the electrode B and the condenser Cc2 is output as the output VB. Consequently, as the difference voltage V0, a voltage corresponding to a capacitance ratio (difference value) between the electrostatic capacitance formed at the electrode A side and the electrostatic capacitance formed at the electrode B side is output, and a stabilized value of the thus-output voltage is output as the sensor output V1 (detection signal) by the synchronous detection circuit.

In this case, the output VA is reduced when the electrostatic capacitance at the electrode A side exceeds the condenser Cc1 due to the contact of the human body or the like.

According to the object detection sensor of this embodiment described above, when an object having a high dielectric ratio, such as the human body, contacts the touch electrode A, even in the case of a small contact area, the electrostatic capacitance between the electrode A and the ground (i.e. the input signal to the detection circuit) changes by a large scale owing to the function of the touch electrode A. Then, the electrostatic capacitance at the time of the object contact is always larger than that formed at the time of non-object contact i.e., at the time when no object contacts by a large scale without a great difference between the electrostatic capacitances formed when the contact areas are small and large.

For instance, in the case where the size of the electrode A is φ30 mm; a plate thickness of the front face portion 12 of the sensor case 11 is 2 mm; the contact area of the human body (usually the fingertip) is φ10 mm; and the touch electrode A is not provided as shown in FIG. 9A, an equivalent circuit between the electrode A and the ground will be that shown in FIG. 9B, so that human body capacitance Cp will be connected to the detection circuit 40 via very small electrostatic capacitance (the electrode A-fingertip electrostatic capacitance) of about 1 pF. That is to say, without the touch electrode A, the input signal (the electrostatic capacitance between the electrode A and the ground) to the detection circuit 40 is weakened in response to a reduction in contact area of the human body or the like.

Figure 4B:
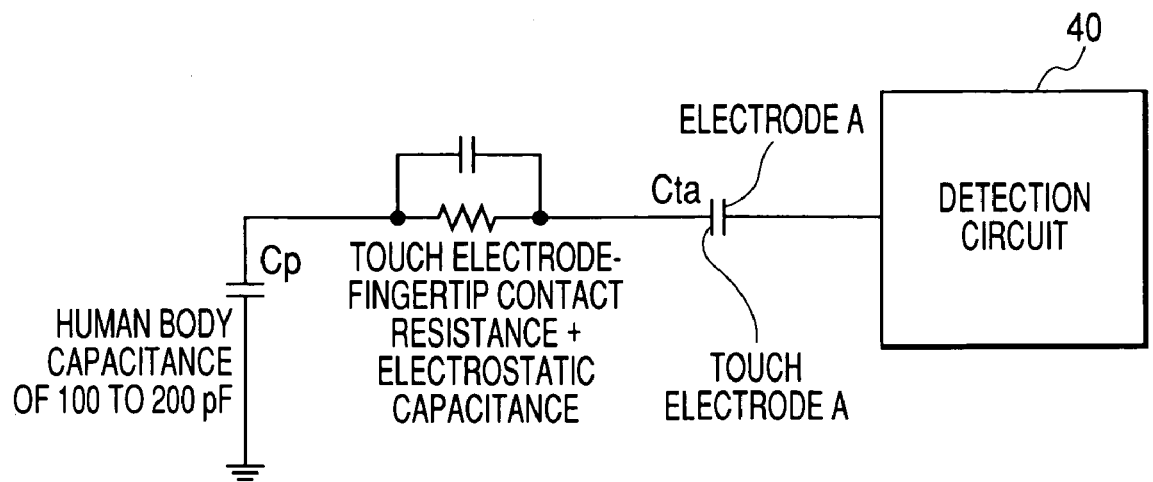
Figure 5:
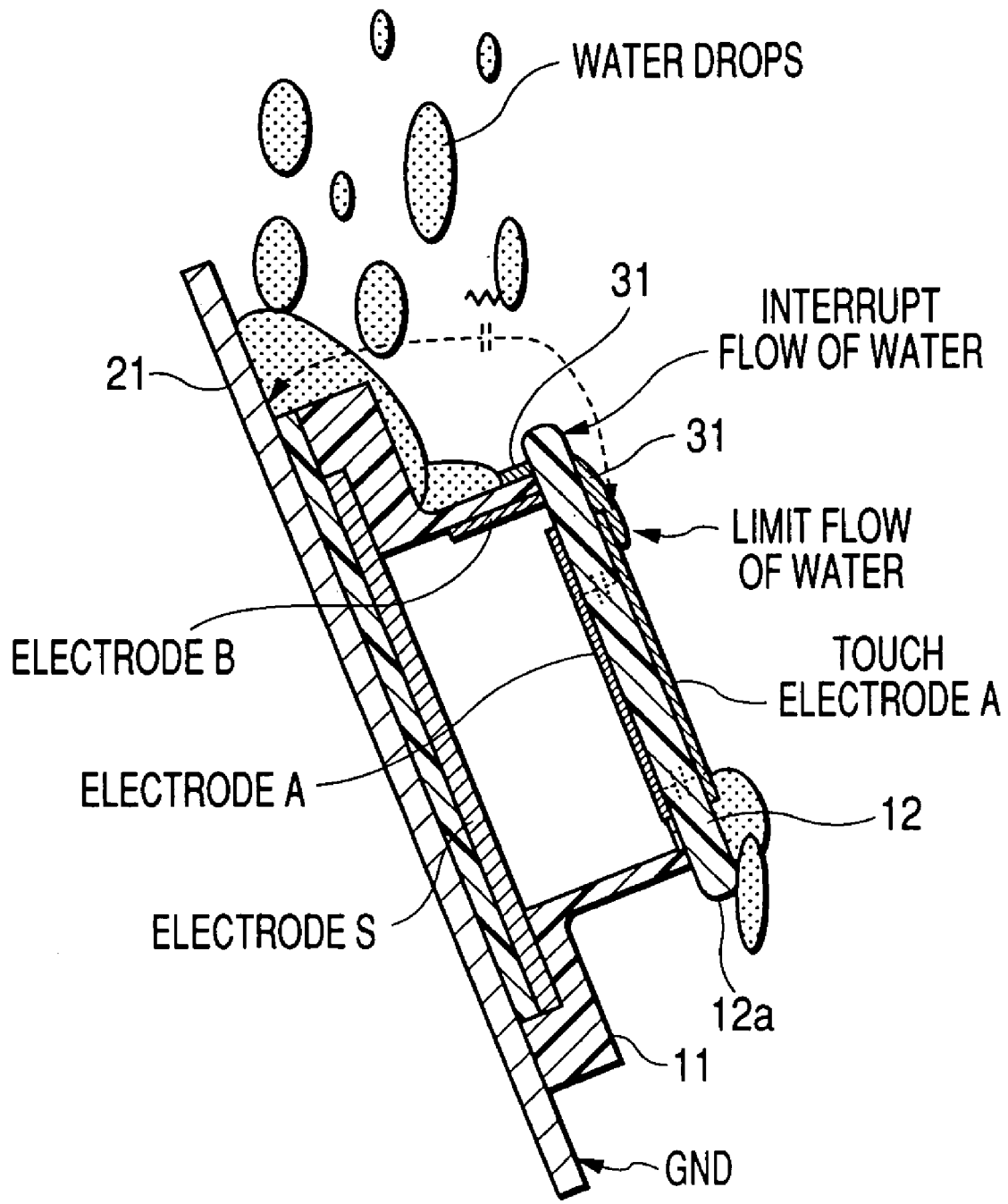

However, in this embodiment where the touch electrode A is provided, since the human body is coupled with the detection electrode A via the contact with the touch electrode A as shown in FIG. 4A, an equivalent circuit shown in FIG. 4B is formed between the electrode A and the ground, so that the human body capacitance Cp is connected to the detection circuit 40 via the large electrostatic capacitance Cta of about 9 pF. Since the touch electrode A and the human body (between the touch electrode and the fingertip) are coupled with each other by the circuit wherein the touch electrode-fingertip electrostatic capacitance and the touch electrode-fingertip contact resistance are parallelly connected as shown in FIG. 4B, impedance is lowered even when the contact area is very small. Therefore, with the touch electrode A, the electrostatic capacitance (the input signal to the detection circuit 40) scarcely changes even when the contact area such as the human body or the like is small and the electrostatic capacitance when the contact area is small is only slightly different from that formed when the contact area is large. Further, the large difference between the input signal at the time of the contact, i.e., at the time then the human body or the like contacts and the input signal at the time of the non-contact is ensured even when the contact area is small.

Thus, the human body or the like is reliably detected even when the contact area is small without increasing the sensitivity of the detection circuit 40. Consequently, it is possible to improve usability and responsiveness with the aforementioned disadvantages which accompany the increase in sensitivity of the detection circuit 40 being avoided. Also, since the detection electrode 13 (electrode A) which is connected to the detection circuit 40 is disposed on the inner surface of the sensor case 11 which serves as the supporting member in the object detection sensor of this embodiment, the aforementioned drawback which accompanies the exposure of the detection electrode from the outer surface is overcome.

Since the object detection sensor of this embodiment is a differential type for detecting the difference between signals corresponding to the two detection electrodes (the electrode A and the electrode B), the noise such as water drops and influences such as temperature drifts are cancelled out to achieve a more sensitive and highly reliable contact detection.

Particularly, since the difference correction touch electrode 16 (touch electrode B) which is capacitance-coupled with the difference correction detection electrode 15 (electrode B) is provided in the object detection sensor of this embodiment, it is possible to keep the electrostatic capacitance formed by the electrode A and the electrostatic capacitance formed by the electrode B at an identical value at the time of non-contact, thereby making it possible to improve accuracy of the above-described canceling to the maximum degree.

The shield electrode 17 for shielding is disposed in such a fashion as to cover the non-detection region including at least the back side of the electrode A in this embodiment. Therefore, owing to the shielding effect of the shield electrode 17, it is possible to improve directivity of the detection side (the surface on which the touch electrode A is disposed) particularly and to ultimately reduce probability of malfunction occurring when a dielectric contacts a position which is not the desired detection position, such as a back surface of the sensor case 11. Further, it is possible to eliminate adverse influences of a component (the car body 21 in this case) which is disposed on the back side of the electrode A or the like and has the ground potential, thereby avoiding performance decrement otherwise caused by the influences of the component.

Also, the front face portion 12 of the sensor case 11 is projected from the mounting face on the back side; the touch electrode A is disposed on the outer surface of the projected front face portion 12; and the electrode A is disposed on the inner surface of the front face portion 12 in this embodiment. Therefore, it is possible to reduce the probability of malfunction due to water even in the case where the rain directly falls on the object detection sensor. This is because the above-described projected shape of the sensor case 11 prevents, as shown in FIG. 5, the outer surface of the front face portion 12 on which the touch electrode A is disposed from being covered with water as well as prevents water from flowing in such a manner as to continuously cover the portion between the touch electrode A and the car body 21 at the ground side.

In this case, particularly since the laterally projecting protection portion 12a is formed on the whole periphery of the front face portion 12 to achieve the mushroom-like shape of the sensor case 11, it is possible to more reliably prevent water from adhering to the portion between the touch electrode A and the car body 21 at the ground side in such a manner as to continuously cover the portion by interrupting the water with the protection portion 12a.

In addition, in order to improve thus-described functions of interrupting, removing and restricting water, a water protection cover 31 shown in FIG. 5 may be provided around the protection portion 12a. Referring to FIG. 5, the water protection cover 31 is the projection portion formed on an outer periphery of the touch electrode A or on a back side of the protection portion 12a.

The present invention is not limited to the above-described embodiment, and various modifications and applications are possible.

Figure 6A:
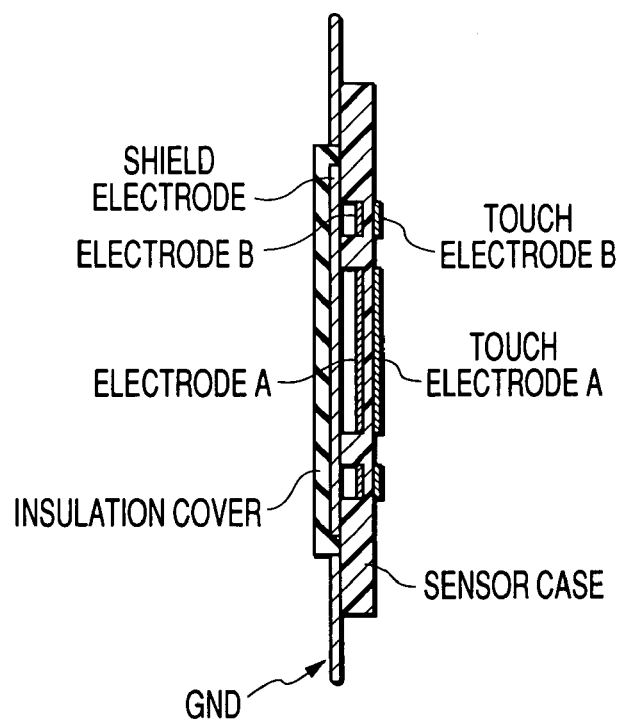
FIGS. 6A and 6B are diagrams showing another example of object detection sensor.
Figure 6B:
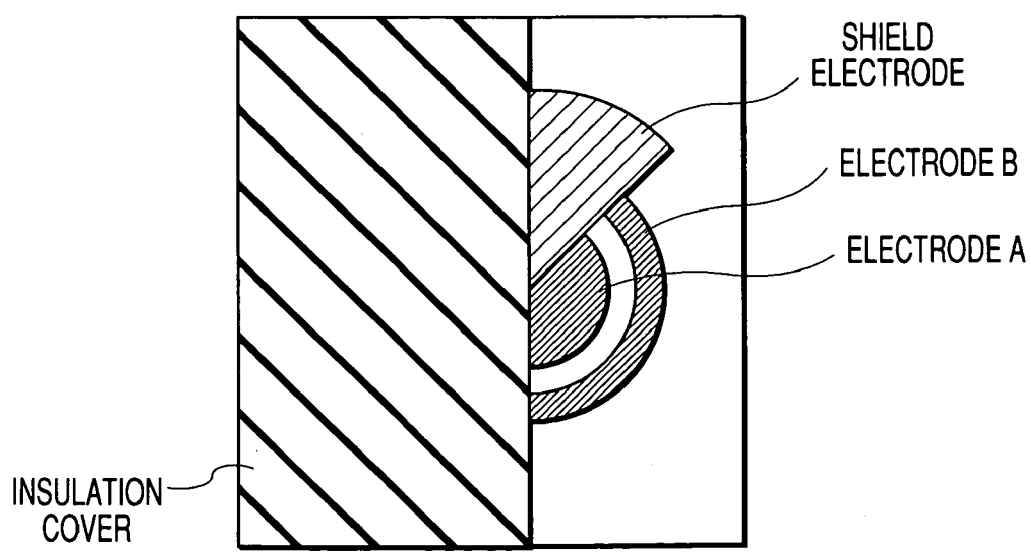

For instance, when it is unnecessary to consider the influences of water (when the object detection sensor is used in a building which is free from water scattering, for example), the electrodes may be provided in a plate-like sensor case shown in FIGS. 6A and 6B, and the sensor case may not necessarily have the mushroom-like shape described above.

Further, when it is possible to sufficiently reduce the probability of malfunction due to water only by the function of the electrode B and the projection shape of the sensor case (when the torrential rain does not fall on the object detection sensor, for example), an embodiment wherein the protection portion 12a and the water protection cover 31 described above are omitted as shown in FIG. 7A may be employed.

Figure 7A:
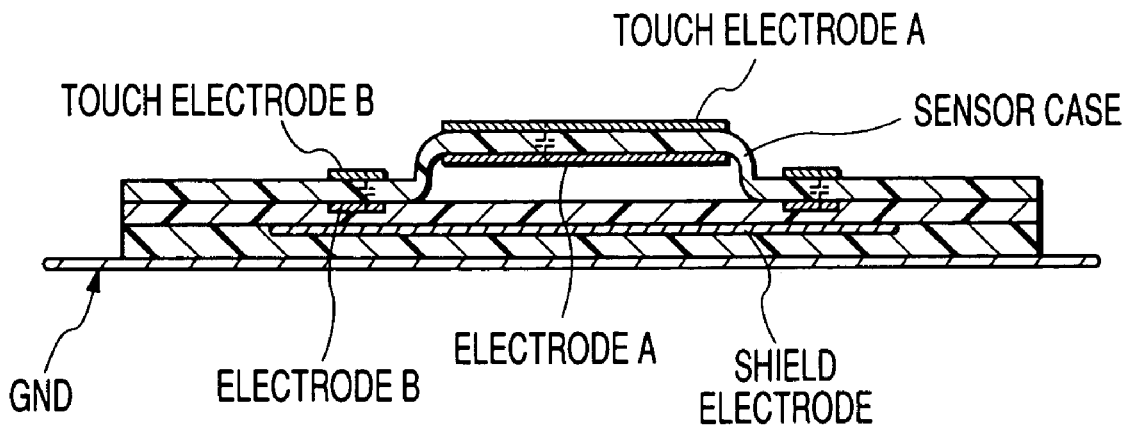
FIGS. 7A and 7B are diagrams showing yet another example of object detection sensor.

The height of the projection of the sensor case may be relatively lower as shown in FIG. 7A in some cases.

Figure 7B:
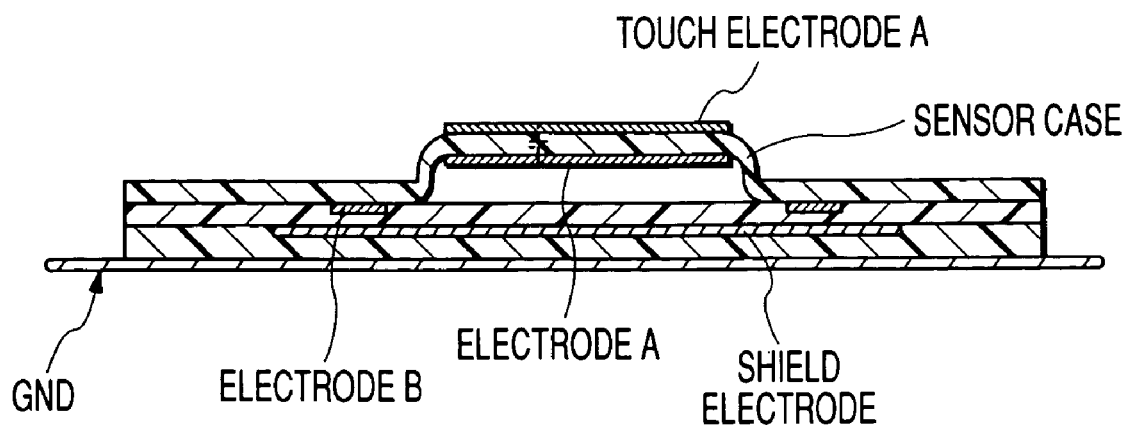
Figure 8A:
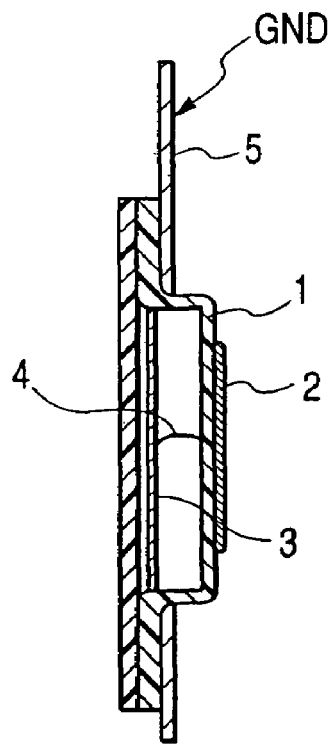
FIGS. 8A and 8B are diagrams showing a conventional object detection sensor.
Figure 8B:
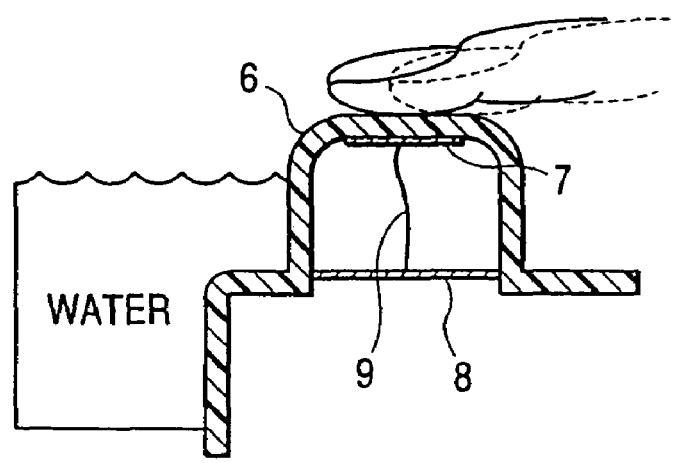

The touch electrode B corresponding to the electrode B is not always necessary, and it may be omitted as shown in FIG. 7B in some cases.

The configuration of the detection circuit is not limited to that described in the above-described embodiment. The present invention is basically characterized by the constitution of the sensor body of electrostatic capacitance type wherein the detection electrode and the touch electrode are disposed on the inner surface and the outer surface of the supporting member in such a fashion as to sandwich the supporting member, and the detailed configuration and the like of the detection circuit is not particularly limited.

According to the invention, it is possible to reliably detect the human body or the like without increasing the sensitivity of the detection circuit even when the contact area is small. Consequently, it is possible to improve usability and responsiveness with the aforementioned disadvantages accompanying the increase in sensitivity of the detection circuit being avoided.

What is claimed is:

1. An object detection sensor comprising:
    a supporting member made from an insulating material;
    a detection electrode disposed on an inner surface of the supporting member;
    a touch electrode which is disposed on an outer surface of the supporting member at a position opposed to the detection electrode and capacitance-coupled to the detection electrode; and
    a detection circuit which is connected to the detection electrode and detects a contact of an object with the touch electrode based on a change in electrostatic capacitance between the detection electrode and the ground and to output a detection signal,
    wherein a difference correction detection electrode is disposed at a position which is on a periphery of the detection electrode and on the inner surface of the supporting member, and the detection circuit operates a difference between a value corresponding to the electrostatic capacitance between the detection electrode and the ground and a value corresponding to electrostatic capacitance between the difference correction detection electrode and the ground so as to detect a contact of an object with the touch electrode based on the change in the difference and to output a detection signal.

2. The object detection sensor according to claim 1, further comprising a difference correction touch electrode which is disposed on the outer surface of the supporting member at a position opposed to the difference correction detection electrode and capacitance-coupled to the difference correction detection electrode.

3. The object detection sensor according to claim 1, wherein a shield electrode for shielding is provided in such a fashion as to cover a non-detection region including at least a back side of the detection electrode.

4. The object detection sensor according to claim 1, wherein the supporting member has a front face portion projected from a mounting face of a backside; the touch electrode is disposed on an outer surface of the projected front face portion; and the detection electrode is disposed on the inner surface of the front face portion.

5. The object detection sensor according to claim 4, wherein a laterally projecting protection portion is formed on each of side rims of the front face portion of the supporting member.

6. The object detection sensor according to claim 1, wherein the supporting member is mounted on a car body in such a fashion that the touch electrode is exposed at a specific position on a surface of the car body, so that the touch electrode functions as a vehicle sensor for detecting a contact of an object with the specific position.

7. The object detection sensor according to claim 6, wherein at least the touch electrode constitutes an accessory member provided on the car body surface.

8. The object detection sensor according to claim 7, wherein at least a portion between the touch electrode and the detection electrode of the supporting member functions as a base of the accessory member provided on the car body surface; and the touch electrode is in the form of a coating layer for covering an outer surface of the base.

* * * * *